United States Patent
Bhattacharya et al.

(10) Patent No.: US 12,332,301 B2
(45) Date of Patent: Jun. 17, 2025

(54) MEASURING DEVICE DEFECT SENSITIZATION IN TRANSISTOR-LEVEL CIRCUITS

(71) Applicant: Synopsys, Inc., Mountain View, CA (US)

(72) Inventors: Mayukh Bhattacharya, Palo Alto, CA (US); Jonti Talukdar, Durham, NC (US); Shan Yuan, San Jose, CA (US); Huiping Huang, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 393 days.

(21) Appl. No.: 18/071,080

(22) Filed: Nov. 29, 2022

(65) Prior Publication Data

US 2024/0061035 A1   Feb. 22, 2024

Related U.S. Application Data

(60) Provisional application No. 63/398,424, filed on Aug. 16, 2022.

(51) Int. Cl.
*G01R 31/28* (2006.01)
*G06F 30/323* (2020.01)
*G06F 30/3308* (2020.01)

(52) U.S. Cl.
CPC ....... *G01R 31/2848* (2013.01); *G06F 30/323* (2020.01); *G06F 30/3308* (2020.01)

(58) Field of Classification Search
CPC .............. G01R 31/2848; G06F 30/323; G06F 30/3308; G06F 30/33; G06F 30/3323
See application file for complete search history.

(56) References Cited

U.S. PATENT DOCUMENTS

| | | | | |
|---|---|---|---|---|
| 9,594,858 | B1 * | 3/2017 | Tseng | G06F 30/3312 |
| 10,133,835 | B1 * | 11/2018 | MacDonald | G06F 30/367 |
| 10,402,525 | B1 * | 9/2019 | Li | G06F 30/30 |
| 11,080,444 | B1 * | 8/2021 | Kumar | G06F 30/3308 |
| 11,579,994 | B2 * | 2/2023 | Bhattacharya | G06F 11/263 |
| 11,620,424 | B2 * | 4/2023 | Bhattacharya | G06F 30/3308 |
| | | | | 716/112 |
| 2010/0106476 | A1 * | 4/2010 | Dong | G06F 30/367 |
| | | | | 703/14 |

(Continued)

*Primary Examiner* — Nha T Nguyen
(74) *Attorney, Agent, or Firm* — Patterson + Sheridan, LLP

(57) ABSTRACT

A method of determining defect sensitization includes parsing a netlist of a circuit design to determine a plurality of potential defects and partitioning the circuit design into a plurality of blocks. The method also includes generating a graph representing the circuit design and determining a transitive closure of the graph. The method further includes grouping the plurality of potential defects to produce a plurality of groups of potential defects and selecting a potential defect from each group of the plurality of groups to form a simulation group of potential defects. The method also includes simulating the circuit design by injecting, into the circuit design, every potential defect of the simulation group to produce a set of outputs of the plurality of blocks and determining a defect sensitization for the simulation group of potential defects based on the set of outputs of the plurality of blocks.

8 Claims, 16 Drawing Sheets

(6 of 16 Drawing Sheet(s) Filed in Color)

(56) References Cited

U.S. PATENT DOCUMENTS

2012/0159409 A1* 6/2012 Guo .................... G06F 30/3323
716/106
2014/0059507 A1* 2/2014 Sunter .................... G06F 30/33
716/112
2021/0326227 A1* 10/2021 Bhattacharya ..............................
G01R 31/318357

* cited by examiner

MEASURING DEVICE DEFECT SENSITIZATION IN TRANSISTOR-LEVEL CIRCUITS

RELATED APPLICATION

This application claims priority to and the benefit of U.S. Provisional Patent Application Ser. No. 63/398,424, entitled "MEASURING DEVICE DEFECT SENSITIZATION IN TRANSISTOR-LEVEL CIRCUITS," filed Aug. 16, 2022, which is incorporated herein by reference in its entirety.

TECHNICAL FIELD

The present disclosure relates to electronic circuit design simulation.

BACKGROUND

Electronic circuit designs may be tested and verified at multiple stages of the design process. For example, circuit designs may be simulated with injected defects (e.g., short circuits, open circuits, electrostatic discharge, etc.) to test the robustness of the circuit design and how sensitive or resistant the circuit design is to particular defects. If a particular defect causes the circuit design to respond incorrectly to certain sets of input, then the circuit design may need to be changed to make the circuit less sensitive to or more resistant against the defect.

SUMMARY

The present disclosure describes systems and methods for determining defect sensitization. According to an embodiment, a method of determining defect sensitization includes parsing a netlist of a circuit design to determine a plurality of potential defects and partitioning the circuit design into a plurality of blocks. The method also includes generating, based on the plurality of blocks, a graph representing the circuit design and determining a transitive closure of the graph indicating reachability relationships among the plurality of blocks. The method further includes grouping the plurality of potential defects based on the reachability relationships among the plurality of blocks indicated by the transitive closure of the graph to produce a plurality of groups of potential defects and selecting a potential defect from each group of the plurality of groups to form a simulation group of potential defects. The method also includes simulating the circuit design by injecting, into the circuit design, every potential defect of the simulation group to produce a set of outputs of the plurality of blocks and determining a defect sensitization for the simulation group of potential defects based on the set of outputs of the plurality of blocks.

Partitioning the circuit design into a plurality of blocks may include identifying a plurality of power-nets in the circuit design and disconnecting the circuit design at a portion of the plurality of power-nets to form the plurality of blocks.

The graph may be a directed graph, and each node of the directed graph may be a block of the plurality of blocks.

An edge in the graph may indicate a direction of signal propagation in the circuit design.

The method may include probing an input port and output port of each node in the graph and simulating the circuit design to produce a plurality of waveforms for the input port and the output port of each node in the graph. Determining the defect sensitization may include comparing the plurality of waveforms to the set of outputs of the plurality of blocks. Comparing the plurality of waveforms to the set of outputs of the plurality of blocks may include calculating an absolute difference between the plurality of waveforms and the set of outputs of the plurality of blocks time-point by time-point, integrating the absolute difference to produce a value, and dividing the value by a total transient time.

Potential defects in a first group of the plurality of groups of potential defects may have no effect on sensitization of potential defects in a second group of the plurality of groups of potential defects different from the first group.

According to another embodiment, a method of determining defect sensitization includes parsing a netlist of a circuit design to determine a plurality of potential defects and partitioning the circuit design into a plurality of blocks. The method also includes, for each block of the plurality of blocks, simulating the circuit design by injecting the plurality of potential defects into the plurality of blocks to produce a set of outputs of the plurality of blocks and determining a defect sensitization for the plurality of potential defects based on the set of outputs of the plurality of blocks.

Partitioning the circuit design into a plurality of blocks may include identifying a plurality of power-nets in the circuit design and disconnecting the circuit design at a portion of the plurality of power-nets to form the plurality of blocks.

The method may include generating, based on the plurality of blocks, a graph representing the circuit design. The graph may be a directed graph, and each node of the directed graph may be a block of the plurality of blocks. An edge in the graph may indicate a direction of signal propagation in the circuit design. The method may include probing an input port of each node in the graph and simulating the circuit design to produce a plurality of waveforms for the input port of each node in the graph. Simulating the circuit design by injecting the plurality of potential defects into the plurality of blocks may include using the plurality of waveforms as inputs to the plurality of blocks.

The method may include, for each block of the plurality of blocks, simulating the circuit design without injecting the plurality of potential defects into the plurality of blocks to produce a set of baseline outputs of the plurality of blocks. Determining the defect sensitization may include comparing the set of baseline outputs with the set of outputs of the plurality of blocks.

According to another embodiment, a method of determining defect sensitization includes parsing a netlist of a circuit design to determine a plurality of potential defects and creating a simulation netlist that includes a plurality of circuits. Each circuit of the plurality of circuits is injected with a potential defect of the plurality of potential defects. The method also includes simulating each circuit of the plurality of circuits in the simulation netlist to produce a set of outputs of the plurality of circuits and determining a defect sensitization for the plurality of potential defects based on the set of outputs of the plurality of circuits.

Each circuit of the plurality of circuits may be simulated in parallel.

The method may include simulating the plurality of circuits to produce a set of baseline outputs for the plurality of circuits. Determining the defect sensitization may include comparing the set of outputs of the plurality of circuits with the set of baseline outputs for the plurality of circuits.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale. The patent or application file contains at least one drawing executed in color. Copies of this patent or patent application publication with color drawing(s) will be provided by the Office upon request and payment of the necessary fee.

DETAILED DESCRIPTION

Figure 1A:
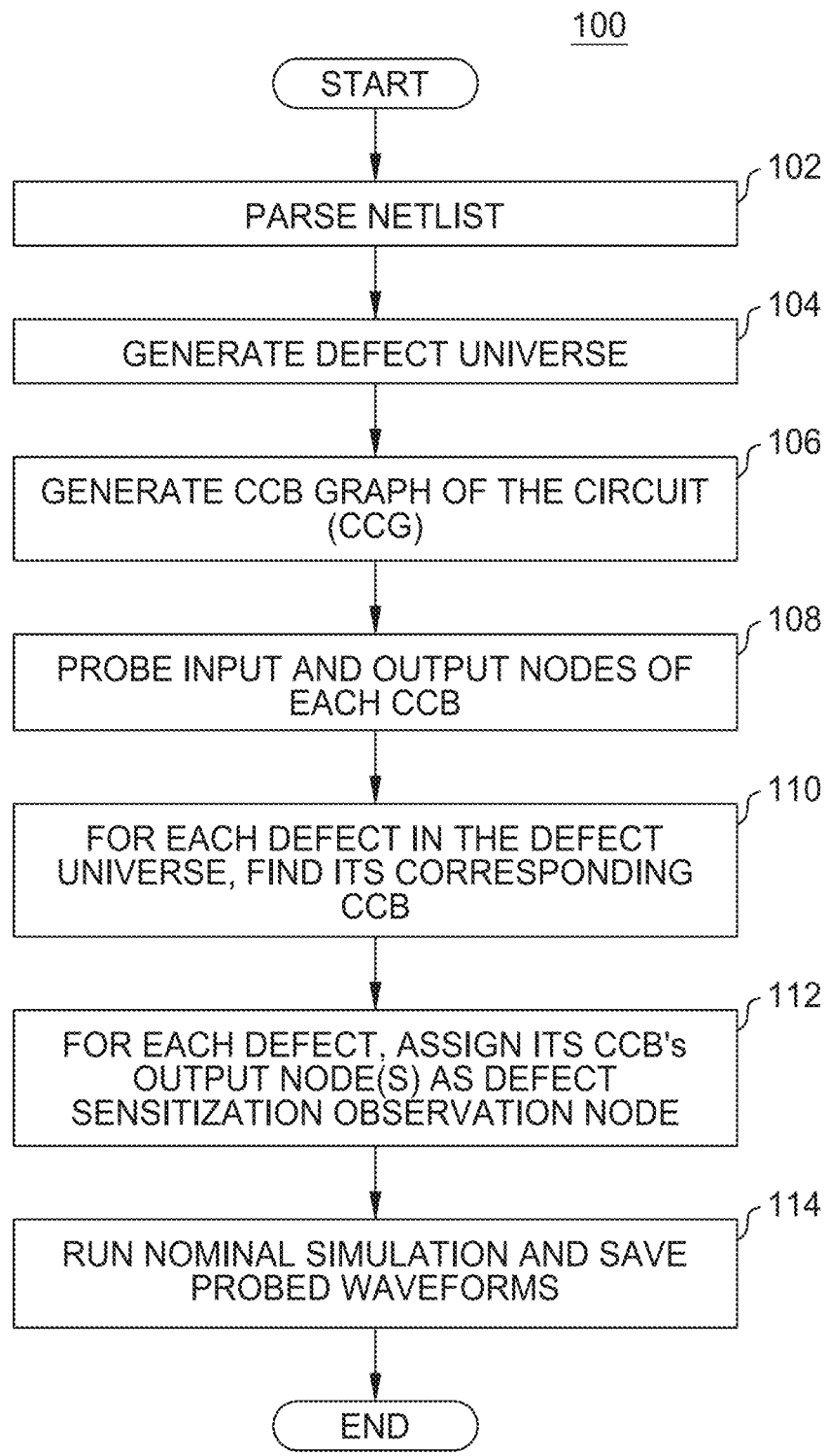
FIGS. 1A, 1B, and 1C are flowcharts of example techniques for determining defect sensitization.

Aspects of the present disclosure relate to measuring defect sensitization in transistor-level circuits. Electronic circuit designs are tested and verified at multiple stages of the design process. Typically, the electronic circuit designs are simulated with injected defects to test how sensitive the electronic circuit design is to the defects (e.g., whether the defects cause the circuit design to respond incorrectly). How sensitive the circuit design is to analog defects may be more challenging to measure, particularly because analog defects are typically injected or simulated one at a time, which is slow. For example, there may be a simulation for each defect (e.g., open circuit, short circuit, etc.) injected at a location in the circuit design where the defect may potentially occur. As a result, the overall simulation time grows as the circuit design becomes more complex.

The present disclosure describes various techniques for determining defect sensitization in an electronic circuit design that may be faster than existing simulation techniques. The defect sensitization may be a measure of how likely the circuit design is to respond incorrectly when a particular defect (e.g., open circuit, short circuit, etc.) occurs in the circuit design. In each of these techniques, defect simulations may occur in parallel, which improves the speed of the simulation. In a first technique, defects that are independent of each other are identified and then simulated in parallel. In a second technique, channel-connected blocks (CCBs) of a circuit design (e.g., groups of devices in the circuit design that are connected through low-impedance terminals) are identified and then the blocks are simulated in parallel. The CCBs may be identified after disconnecting power nets (e.g., signals that touch many transistor channels or bulk terminals of MOSFETs), bit lines (e.g., signals that touch certain MOSFET channels), and high impedance terminals of MOSFETs (e.g., gate terminals). This disconnection step partitions the circuit into smaller blocks of devices that are connected through low-impedance terminals, which forms the CCBs. The CCBs may then be simulated in parallel. In a third technique, a device of a circuit design is replicated multiple times with different defects injected into the copies of the device. The multiple copies of the same device are then simulated together, and the different devices are simulated in parallel. Each of these simulation techniques may reveal defect sensitizations in the circuit design, which may be helpful in understanding what kinds of defects may occur in different parts of the circuit design.

In transistor-level analog or mixed-signal circuit design, a designer or a test engineer assesses the impact of test stimuli via circuit simulation in various stages of integrated circuit design and manufacturing, including during test pattern generation. Exhaustive defect simulation is a slow process. In many cases, fast approximate estimation of defect sensitization is used. The present disclosure describes methodologies or techniques to accurately estimate sensitization of various defects due to the application of test stimuli, which are much more efficient than full-circuit defect simulation, in certain embodiments.

For industrial circuits with millions of devices, transistor-level circuit simulation may be the most accurate way to predict how the circuit will perform after manufacturing. Traditionally, this simulation involves measuring various node voltages or branch currents or power to verify if they meet specifications. Simulation may also be used to evaluate other aspects of a circuit's behavior such as comparing multiple sets of input stimuli for fault or defect sensitization.

Defect or fault sensitization in transistor-level analog simulation has gained tremendous importance due to the automotive industry's focus on functional safety and due to the increased interest in manufacturing test and reliability of analog components. Because analog fault or defect simulation can be very expensive, getting an approximate but quick assessment of the test stimulus quality through minimum simulation effort is becoming important. The present disclosure presents various techniques that provide the analog designer with the ability to develop better test stimuli with much less effort than previously possible, in certain embodiments. Existing techniques may be based on monitoring node voltages, branch currents, and their derivatives and trying to use such quantities to predict if an open or a short defect associated with a device would be covered by the test stimulus or not. Because such techniques do not actually inject open or short defects into the circuit, nodal voltages and branch currents are weak indicators of defect sensitization. In contrast, the present techniques inject the defects into the circuit or the device and then monitor local voltage or current behaviors to predict defect sensitization more accurately, in certain embodiments.

Advantages of the present disclosure include, but are not limited to, reducing the amount of time it takes to simulate defects. Generally, the various techniques described herein reduce simulation time by performing certain portions of the simulation in parallel. In some embodiments, a computing system identifies defects in the circuit design that are independent of each other and then simulates the independent defects in parallel, which reduces the simulation time. In particular embodiments, the computing system partitions the circuit design into CCBs and then simulates the CCBs in parallel, which reduces the simulation time. In certain embodiments, the computing system replicates devices in the circuit design and injects different defects into the different copies of the devices. The computing system then simulates the copies of a device together and the multiple devices in parallel, which reduces simulation time. In some embodiments, simulating defects in parallel reduces the amount of computing resources used relative to when the defects are simulated one by one in the full circuit.

The present disclosure describes three different types of techniques. Techniques 1 and 2 may be used in combination on a circuit to achieve fast and accurate sensitization results. Technique 3 may be used by itself. Technique 3 may be the fastest of the three techniques but it may also be the least accurate. These techniques may be performed by any suitable computing system (e.g., the example computing system 1400 in FIG. 14).

Figure 1B:
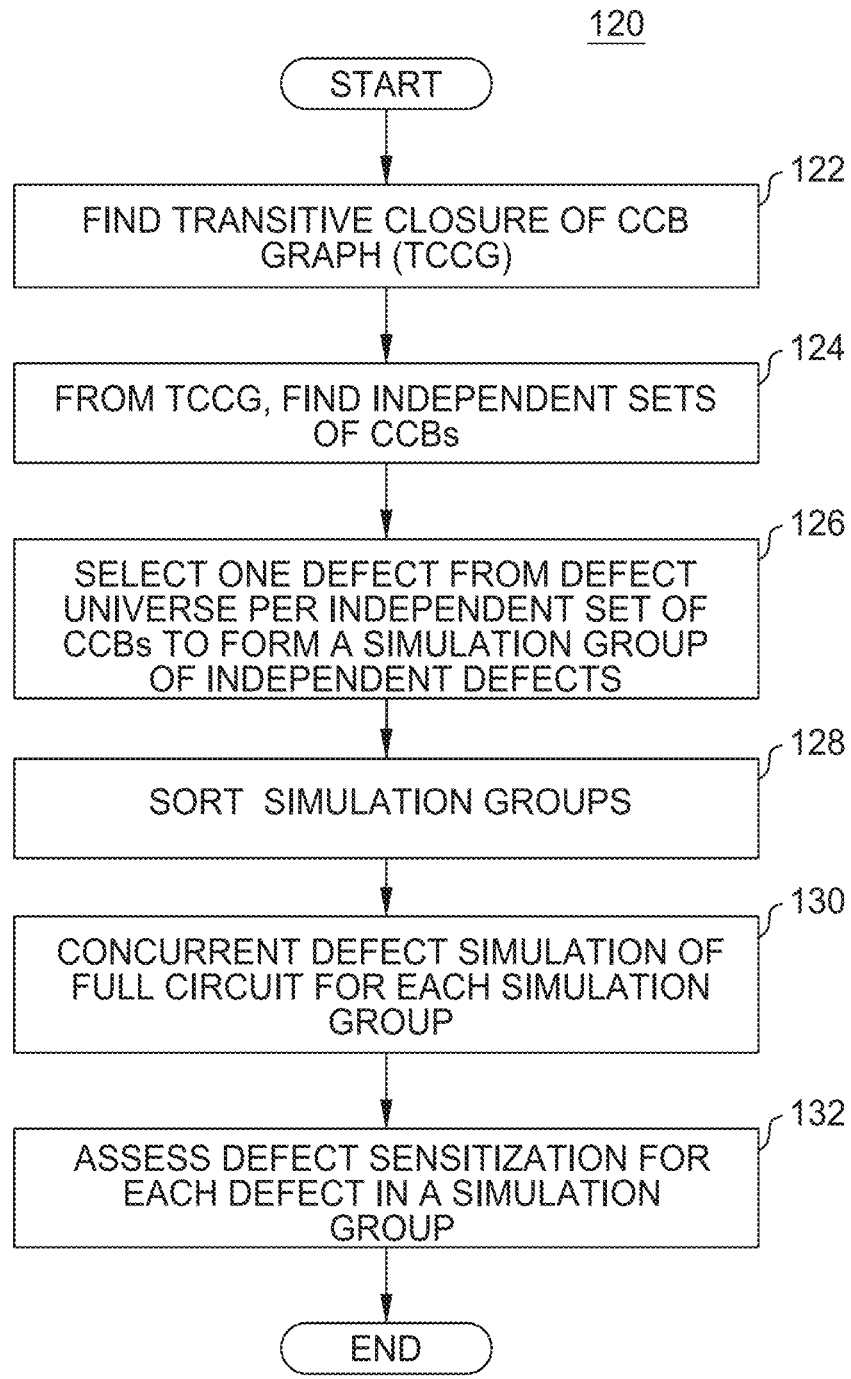
Figure 1C:
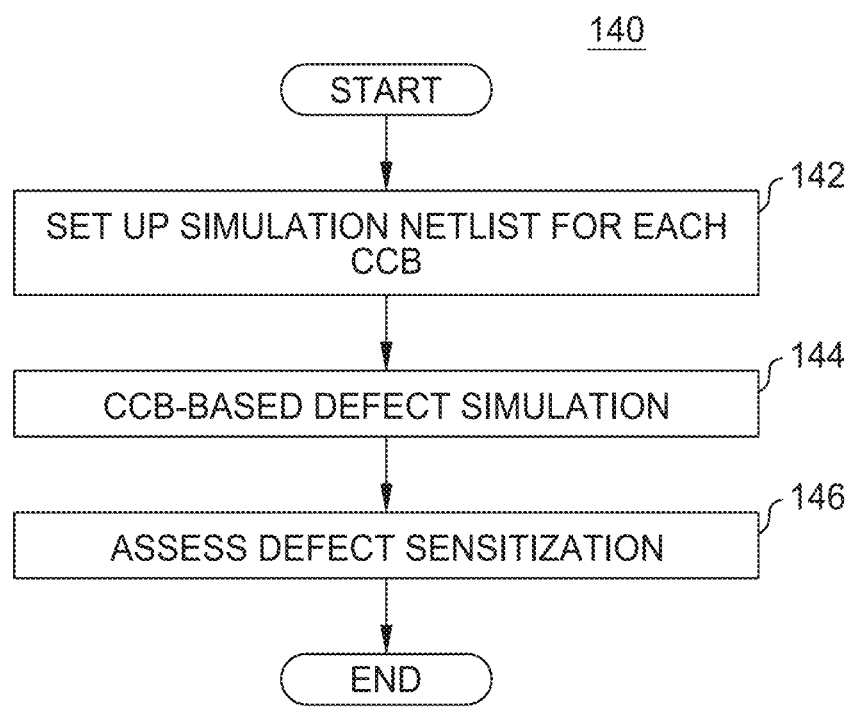

FIGS. 1A, 1B, and 1C describe the overall methodology of integrating Techniques 1 and 2 of estimating defect sensitization, whose combined usage leads to fast assessment of defect sensitization for the whole circuit. FIG. 1A is a flowchart of an example method 100 performed during Techniques 1 and 2. FIG. 1B is a flowchart of an example method 120 performed during Technique 1. FIG. 1C is a flowchart of an example method 140 performed during Technique 2.

Technique 1: Concurrent defect injection and simulation: This technique uses graph-theoretic techniques to discover groups of defects, whose sensitization status can be ascertained by means of one simulation of the full circuit per group. This technique is depicted using FIGS. 1A and 1B. During each simulation, a group of defects is simultaneously or concurrently injected into the circuit.

Technique 2: Partitioned circuit simulation: This technique involves partitioning the circuit into channel-connected blocks (CCBs), simulating a complete defect-free circuit with added probes at the inputs of each CCB, setting up piece-wise-linear (PWL) input sources for each CCB based on the waveforms obtained by full circuit probing, and injecting defects into these CCBs and simulating them. This technique is shown using FIGS. 1A and 1C.

In some embodiments, based on how many defects could be simulated by Technique 1 and the ratio between simulation wall time (e.g., the difference between the time at the start of the simulation and the time at the end of the simulation) for the full circuit versus each CCB, a decision can be made on which defects should be simulated using Technique 1 and then have the rest simulated by Technique 2. For example, if simulating a particular defect using Technique 1 would cause the ratio between simulation wall time for the full circuit and simulation wall time for each CCB to exceed a threshold, then the defect may be simulated using Technique 2 to conserve time. On the other hand, if the ratio does not exceed the threshold, then the defect may be simulated using Technique 1.

FIG. 1A shows an example method 100 that may be performed during both Techniques 1 and 2. In particular embodiments, a computer system (e.g., the example computer system 1400 in FIG. 14) performs the method 100. By performing the method 100, the computer system determines the CCBs in a circuit design and generates baseline output waveforms for the circuit design that may be used later to determine if the circuit design responded incorrectly when particular defects are injected into the circuit design.

At 102, the computer system parses a netlist for the circuit design. Generally, the netlist describes the connectivity for the circuit design. For example, the netlist may identify the components of the circuit design and the nodes to which they are connected. The netlist may be read into a circuit database with this device connectivity information. By parsing the netlist, the computer system may determine the circuit components and how they are connected.

At 104, the computer system generates the defect universe for the circuit design. This step is also known as the "defect compilation" step, where all potential defects in a circuit under test (CUT) may be enumerated. This list of potential defects is known as the defect universe of the CUT. The computer system may analyze the circuit components and the connectivity information determined by parsing the netlist to determine the locations where potential defects (e.g., open circuits, short circuits, etc.) may be injected into the circuit design. Each location and the type of defect that may be injected at that location may be stored in the list of defects, which may be an enumerated list. In this disclosure, it is understood that a defect in the defect universe is a potential defect that may occur in the circuit design and not necessarily a defect that is actually occurring in the circuit design.

At 106, the computer system generates a CCB graph (CCG) of the circuit design. First, the computer system analyzes the circuit graph for the circuit design to identify power-nets. The circuit graph is a graphical representation of the circuit design and may be generated from the netlist. Nodes of the circuit graph may represent components of the circuit design, and edges of the circuit graph may represent connections between the components in the circuit design. As a result, two nodes in the circuit graph are connected by an edge if the circuit components represented by the nodes are electrically connected in the circuit design. The computer system may analyze the circuit graph to identify features that are indicative of power nets. For instance, signals that touch many transistor channels or bulk terminals of MOSFETs are potential power nets.

Second, sub-graph isomorphism is used to identify arrays of such repetitive structures as memory cells or other elements. Nets which touch the high-impedance gate ports of many devices in such arrays are considered "word-lines," and the nets which were earlier thought of as power nets but touch certain MOSFET channels of some of the cells only are considered to be "bit-lines" (these are no longer considered as power nets).

Third, the circuit graph is disconnected at the power nets and bit lines (if any) and at the high-impedance terminals of all devices. This process causes the entire circuit netlist to be partitioned into channel-connected device connections. That is, two devices remain in the same partition if and only if they are connected through low-impedance terminals (in the case of MOSFETS, the Gate terminal has high-impedance, and the other terminals are low-impedance in nature) unless the low-impedance terminals happen to touch a power net or a bit line. Each of the partitions of devices that are connected through low-impedance terminals is referred to as a channel-connected block (CCB).

Fourth, a directed graph (example of such a graph is presented in FIG. 3) of the circuit is created where each node of the graph is a CCB, and there is an edge between any two nodes if there is a connection between two CCBs. An edge is directed from a low-impedance node in one CCB to a high-impedance node in the other CCB. For instance, if two CCBs (A and B) are formed using two inverters (inverter A and inverter B, respectively) and if inverter A drives inverter B, then the arrow between the two CCBs would be directed from A towards B. The direction of the arrow is related to signal propagation path in a circuit. The resultant graph may be referred to as a channel-connected graph (CCG).

For each CCB, based on its connectivity in the CCB graph, input ports and output ports are identified. For a CCB that may not be driving any other CCB (e.g., if the CCB includes one or more primary outputs of the circuit), such primary output nodes are the outputs of the CCB. The power nodes and bit lines identified above are marked on the corresponding CCB terminals.

Figure 3:
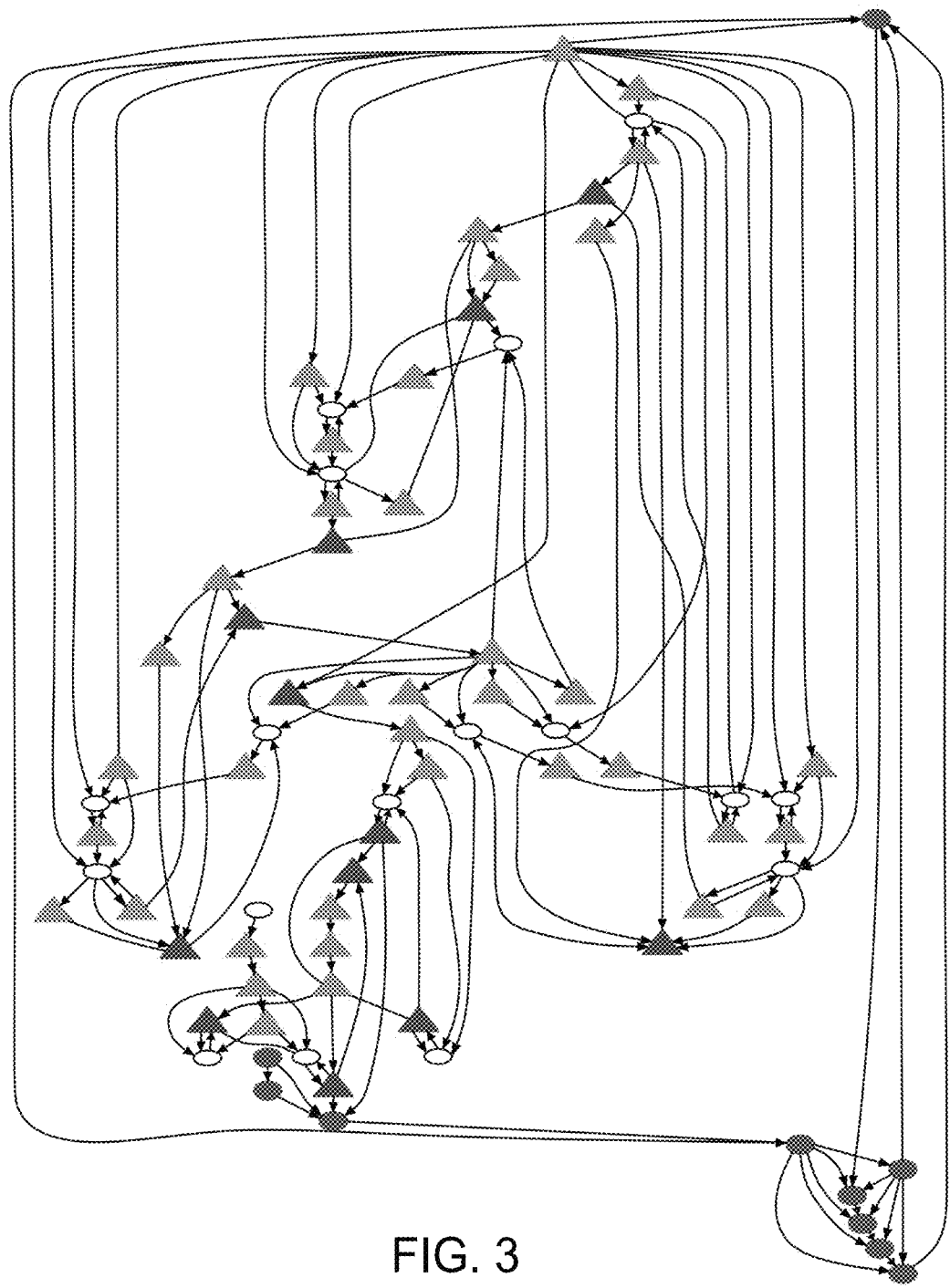
FIG. 3 illustrates an example graph used to determine defect sensitization.

FIG. 3 shows an example directed graph 300. As seen in FIG. 3, the graph 300 includes nodes depicted as green triangles, blue triangles, red circles, and white circles. The graph 300 may be a directed graph of a phase-locked loop (PLL) circuit. Each node of the graph 300 is a CCB. The green triangles may represent inverters in the PLL circuit. The blue triangles may represent two-input NAND and NOR gates in the PLL circuit. The red circles represent analog blocks in the PLL circuit. The white circles represent blocks of unknown functionality in the PLL circuit.

An edge exists between two nodes in the directed graph 300 if there is a connection between the two CCBs represented by the two nodes. Each of the edges has an arrowhead indicating a direction of signal propagation in the PLL circuit.

At 108, the input nodes and outputs nodes of each CCB are probed. The computer system may add probes to the input nodes and output nodes of each CCB so that the signals at the input nodes and the signals at the output nodes may be read, analyzed, and stored. For example, waveforms corresponding to these signals can be saved when the full circuit is simulated at 114.

Figure 4:
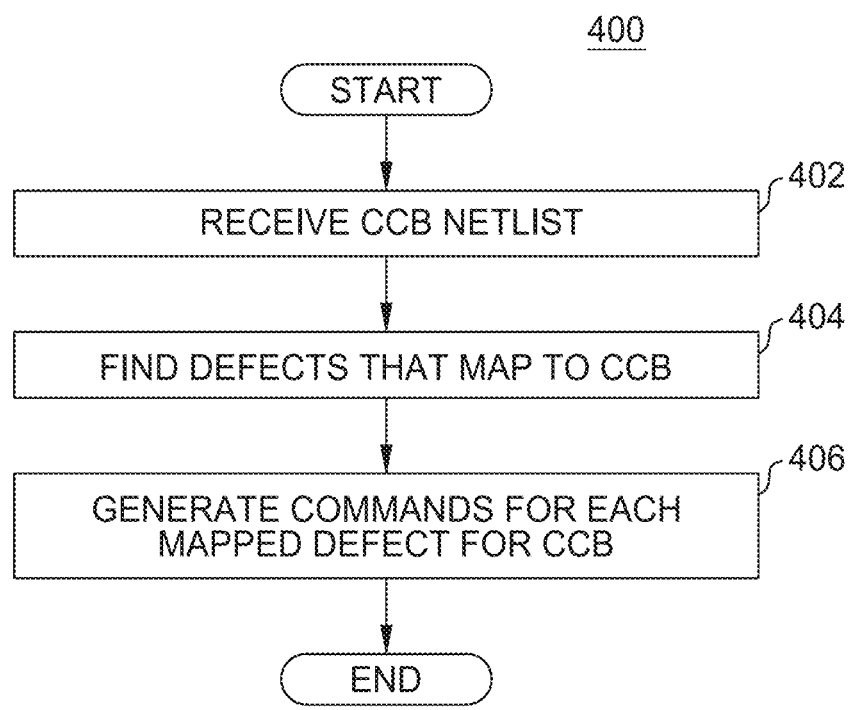
FIG. 4 is a flowchart of an example technique for mapping defects.

At 110, the computer system maps each defect in the defect universe to a CCB in the CCG. FIG. 4 is a flowchart of an example method 400 for mapping defects onto each CCB. At 402, the CCB netlist is received. The CCB netlist may describe the components in each CCB and the connections between the CCBs. The computer system then maps the defects in the defect universe determined at 104 to the CCBs. At 404, a many-to-one mapping is created between the device defects in the defect universe and the CCBs, because each device can belong to one and only one CCB. Sensitization of defects which are not device-related may not considered here. A defect may be considered to not be related to a device if the defect does not directly touch a device. For example, if the defect is a short circuit between two adjacent nets (e.g., wires or connections) in the circuit design, or if the defect is an open circuit in a net in the circuit design, then the defect may not be device-related. At 406, commands for each mapped defect for each CCB are generated. Each command may inject a defect into a particular location of the CCB when the command is executed.

At 112, the computer system maps the defects to observation nodes. For each defect, its CCB's output node or output nodes are assigned as defect sensitization observation nodes. As a result, the output nodes of a CCB are the observation nodes for the defects that were mapped to the CCB at 110.

At 114, the computer system runs a nominal (e.g., defect-free) simulation of the full circuit and saves the waveforms of the signals whose probes were set up at 108. This simulation creates baseline output waveforms for the probed input and output nodes of the CCBs.

FIG. 1B is a flowchart showing a method 120. Generally, the steps of the method 120 are performed during Technique 1. The steps shown in FIG. 1B may be performed after the steps shown in FIG. 1A are performed. In particular embodiments, a computer system (e.g., the computer system 1400 shown in FIG. 14) performs method 120. By performing the method 120, the computer system identifies independent defects and simulates the independent defects in parallel, which may improve simulation time.

Generally, Technique 1 involves using the transitive closure of the CCG to determine different sets of CCBs that are independent of each other. The transitive closure of the CCG is a graph or matrix that indicates whether a node in the CCG is reachable from another node in the CCG. A node is reachable from another node if the edges in the CCG create a path between the two nodes. In a directed graph, the directionality of the edges is taken into account when determining whether the edges create the path between the two nodes. The output of a CCB does not affect CCBs in other sets. Each CCB may have one or more defects assigned to the CCB (e.g., at 112). One defect is selected from each set of CCBs to form a simulation group of defects. Because the defects are selected from independent sets of CCBs, the selected defects are also independent of each other, which may mean that the defects in one simulation group do not affect the sensitization of defects in another simulation group (e.g., how sensitive the circuit design is to the defects in the other simulation group). Every defect from the set is then injected into the full circuit, and the circuit is simulated. In this manner, the selected defects are concurrently simulated.

At 122, the computer system determines the transitive closure of the CCG (TCCG), which may be a directed graph. The computer system may use any suitable process for determining the TCCG. For example, the computer system may use the Floyd Warshall algorithm, which calculates the distance between nodes, to determine whether nodes are reachable.

The transitive closure may take the form of a reachability matrix that indicates, for all node pairs in the CCG, whether one node of the CCG is reachable from another node of the CCG (e.g., whether the edges of the CCG create a path from the other node to the one node). For example, every node in the CCG may be assigned a row and a column in the reachability matrix. The value at a particular row and column indicates whether a path in the CCG exists from the node represented by the row to the node represented by the column.

At 124, the computer system analyzes the TCCG to determine the sets of CCBs that are independent. Two CCBs are independent of one another if the TCCG indicates that the CCBs are not reachable from one another, which indicates that the operation of the CCBs does not influence the operation of the other. As discussed above, the TCCG indicates reachability relationships among the different CCBs. If a CCB is not reachable from another CCB, then inputs to one CCB should not be affected by the output behavior of the other CCB. This is the fundamental premise of discovering CCBs where defects could be simultaneously or concurrently injected without affecting the sensitization measurement for each CCB (e.g., a measurement of how sensitive each CCB is to its injected defect). Stated differently, the TCCG reveals which CCBs are not reachable from other CCBs. The CCBs that are not reachable from one another may be assigned to different sets of CCBs. This process produces one of more sets of CCBs, with CCBs in different sets not being reachable from one another. Thus, an input or output of a CCB in one set has no effect on the input or output of a CCB in another set.

At 126, the computer system divides the defect universe into groups of defects (which may be referred to as "simulation groups") based on the independent sets of CCBs found at 124. Generally, the computer system forms the simulation groups by grouping defects from different sets of independent CCBs. One defect from each set of the independent CCBs is selected to form a simulation group of independent defects. As a result, the defects in one simulation group are independent of one another and have no effect on each other's sensitization (e.g., each defect in the simulation group has no effect on how sensitive the circuit design is to another defect in the simulation group). Because multiple defects could be mapped to the same CCB, each set of independent CCBs could lead to multiple simulation groups of independent defects. However, it is unlikely that the number of defects mapped to each CCB will be identical. Hence, not all the independent defect simulation groups derived from the same independent CCB set would have the same number of defects in them.

At 128, the computer system sorts the various independent simulation groups of defects found at 126. For example, the simulation groups may be sorted according to the size of the simulation groups (e.g., in decreasing order of size or in increasing order of size). The size of a simulation group may be the number of defects in the simulation group.

At 130, the computer system performs concurrent defect simulations. For each independent simulation group of defects from the sorted list of such simulation groups, all the defects in the simulation group are injected simultaneously or concurrently into the full circuit. The same probes that were used at 114 are inserted and the circuit is simulated with the injected defects to produce a set of output waveforms. As a result, the defects from the simulation group are concurrently simulated.

At 132, the computer system assesses defect sensitization. At the end of each defect set simulation at 130, for each of the independent defects injected, the output waveforms corresponding to the nodes that are considered as observation nodes for each of the defects as noted at 112 are observed. The defect free versions of the same signals have been saved at 114. The observation nodes' waveforms between the defective circuit and defect-free circuit are compared to see if there is sufficient difference. Stated differently, the output waveforms produced at 130 are compared with the baseline output waveforms produced at 114. If there is sufficient difference, then the corresponding defect is categorized as sensitized.

The difference between the defective and defect-free signals could be calculated in many ways. The present example calculates the absolute difference between the two signals time-point by time-point, numerically integrating these differences (e.g., by trapezoidal method), and then dividing the value by the total transient time. The unit of such a difference is a Volt. The value of this difference is saved for each defect.

Figure 7:
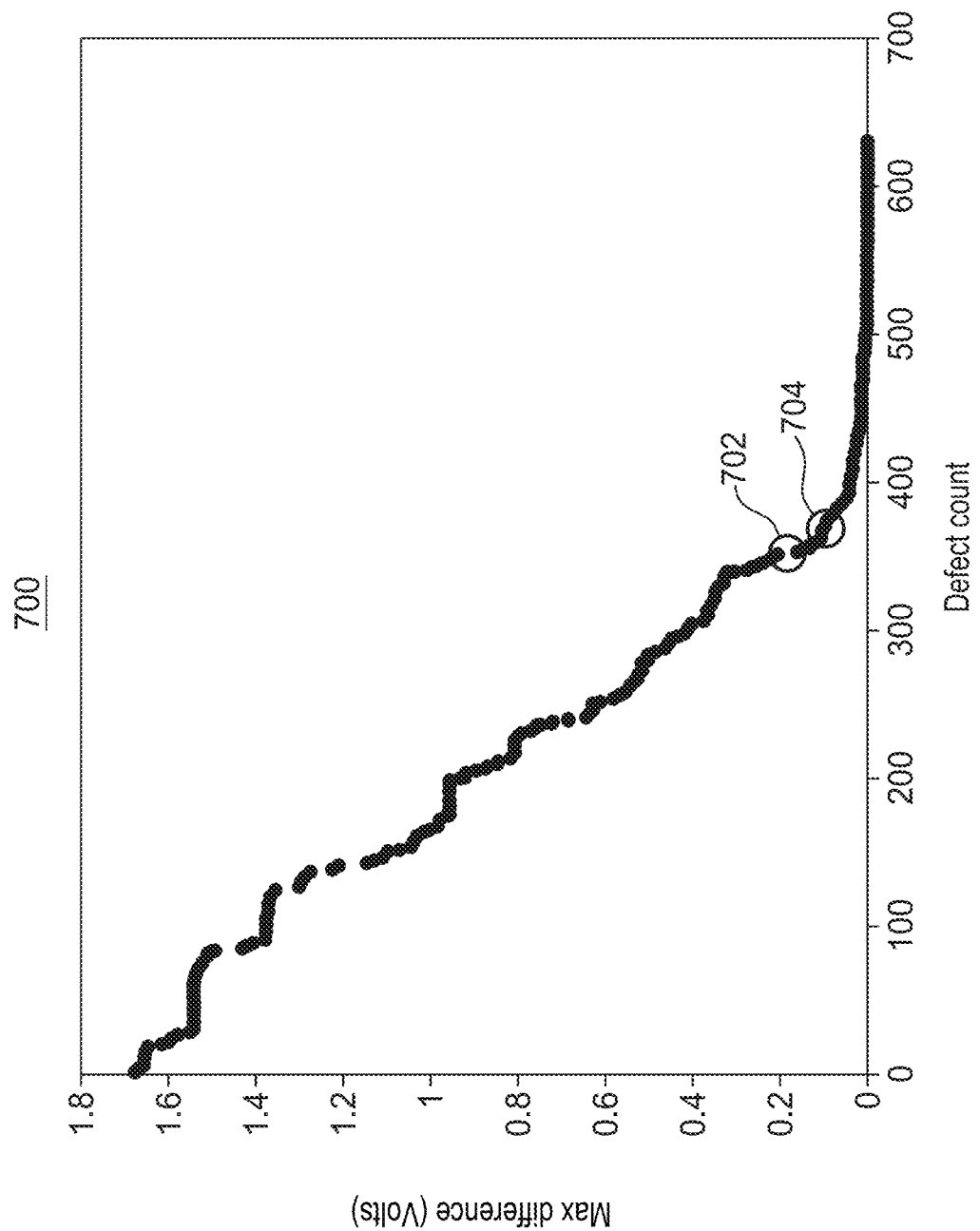
FIG. 7 illustrates an example chart used to determine defect sensitization.
Figure 8:
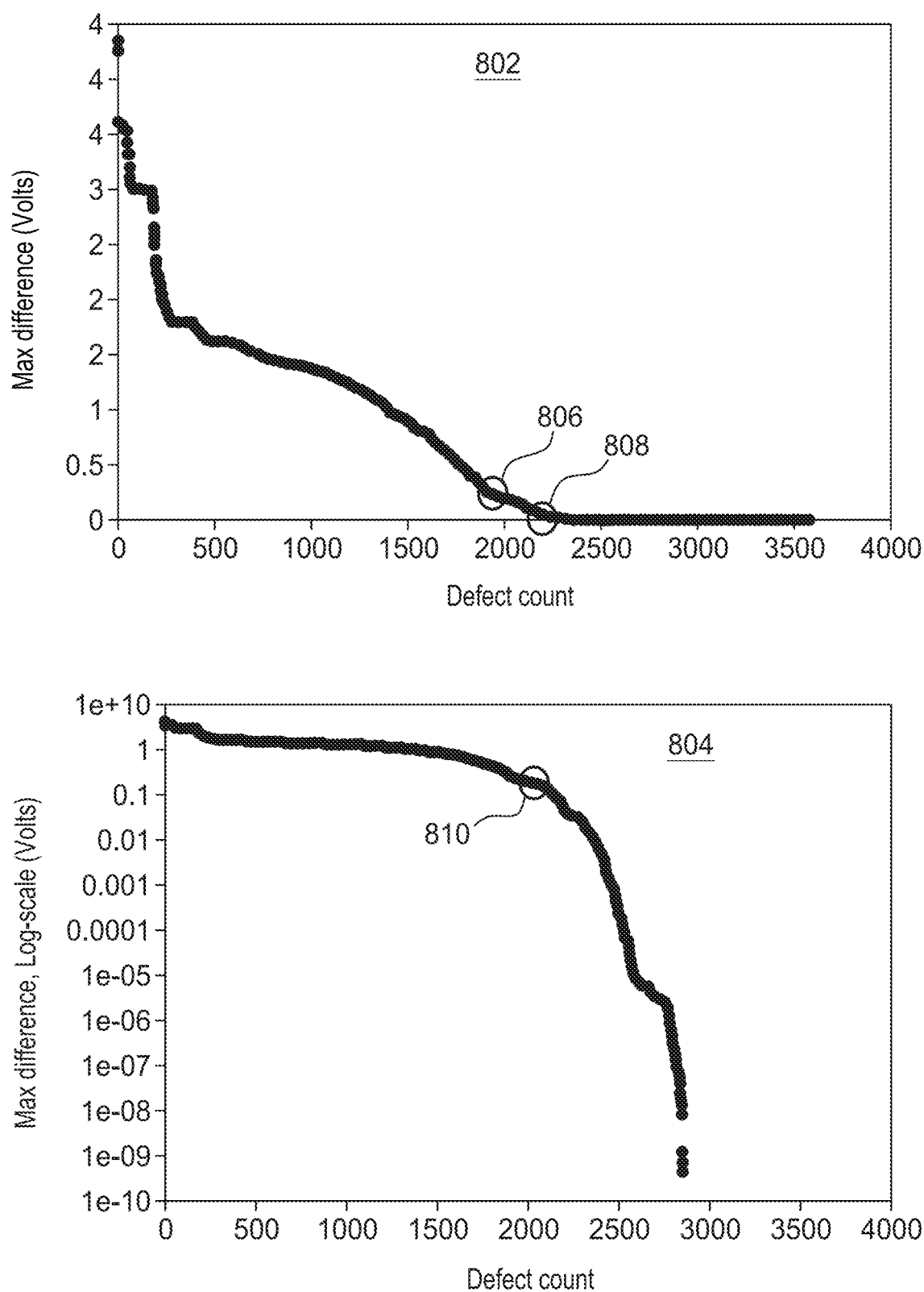
FIG. 8 illustrates example charts used to determine defect sensitization.

Categorization of each defect as sensitized or not, based on the difference value calculated, may be done in several ways. For example, this could be done by using a threshold value that is a fraction of the power supply voltage of the circuit. If the difference value for a defect exceeds the threshold, then the defect may be categorized as sensitized, thus indicating that the sensitivity of the circuit design to the defect should be addressed. If the difference value for a defect does not exceed the threshold, then the defect may be categorized as not sensitized, thus indicating that the sensitivity of the circuit design to the defect need not be addressed. The categorization could also be done by sorting all the difference values of all the defects and finding a "knee" point in such numbers in a linear scale (e.g., as seen in FIG. 7). In some cases, a linear scale graph may not be sufficient to discover a "knee" point accurately. A change of scale (e.g., logarithmic) could be used in such cases (e.g., as seen in FIG. 8). These knee points may establish the thresholds for the difference values.

Thus, by performing Technique 1, the computer system identifies the independent defects in the defect universe and then simulates independent defects in parallel. As a result, multiple defects may be simulated concurrently, which reduces the amount of time it takes for the computer system to simulate every defect. Additionally, the computer system may use fewer computing resources to simulate the defects relative to existing systems that simulate each defect one by one in the circuit design.

FIG. 1C is a flowchart of an example method 140. Generally, the steps of the method 140 are performed during Technique 2. The steps shown in FIG. 1C may be performed after the steps shown in FIG. 1A are performed. In particular embodiments, a computer system (e.g., the computer system 1400 shown in FIG. 14) performs the method 140. By performing the method 140, the computer system simulates each CCB multiple times with different defects injected. As a result, the CCBs may be simulated in parallel, which reduces simulation time.

At 142, the computer system sets up simulation netlists for each of the CCBs that are ready for simulation. At 114, the waveforms for signals corresponding to the input nodes of each of the CCBs were saved. These waveforms are converted into piece-wise-linear (PWL) voltage sources and added to the corresponding CCBs to act as their input excitations and mimic the full circuit's behavior locally in each CCB.

At 144, the computer system simulates each CCB multiple times. The computer system simulates each CCB once without any defect injected to produce a baseline output waveform. The computer system also simulates each CCB with defects injected using each set of input stimuli produced at 142 to produce multiple output waveforms for the injected defects. For the same CCB netlist, one simulation per mapped defect may be sequentially run. The computer system may inject a mapped defect into each CCB. The computer system may then simulate each CCB using the input stimulus produced at 142 for that CCB. The computer system then determines the output signals produced by the CCBs, which are the CCBs' output node voltage waveforms. Because the simulations are independent, they can all be run in parallel.

At 146, the computer system assesses defect sensitization by comparing the defective and defect-free CCB simulations' output node voltage waveforms. Stated differently, the output waveform for each injected defect is compared to the baseline output waveform for the defect-free case to determine differences between the output waveform and the baseline output waveform. If there is sufficient difference, then the corresponding defect is categorized as sensitized. The computer system may use the same techniques described at 132 to assess defect sensitization for the CCBs and to categorize the sensitizations.

Technique 1 and Technique 2 may be complementary in many respects and may be combined for different circuits to obtain the best possible results. Each technique provides different advantages. For example, Technique 1 may simulate multiple defects concurrently into one simulation. Additionally, because the full circuit is simulated, certain feedback effects in the circuit are considered. As another example, the simulation time in Technique 2 may be orders of magnitude faster than Technique 1, because CCB size is much smaller than the full circuit.

Because the two techniques provide different advantages, a judicious combination of the two may provide a better solution. There may be many heuristics to combine the techniques, one such way may be:

Let defect-free full-circuit simulation takes time be: $\tau_F$.
Let average time for defect-free CCB simulation be: $\tau_C$.
Assume that simulation time for full circuit with defects injected, on an average, is also: $\tau_F$.
Assume the number of defects that are being simultaneously injected into a simulation by Technique 1 is: G. This would take an expected time of: $\tau_F$.
If Technique 2 is used to simulate the same defects sequentially on one machine, it is expected to take a time of $\tau_C*G$. If the same defects were simulated on M machines when the CCB simulations can be run as distributed processes, it is expected to take a time of: $\tau_C*G/M$.
Based upon these approximate quantities, it makes sense to use Technique 1 for a group of G concurrent defects if: $\tau_F<\tau_C*G/M$. Otherwise, it makes more sense to use Technique 2.

$\tau_F$ and $\tau_C$ are approximations-simulation time of a defective circuit may be quite different from defect-free full circuit and simulation times of different CCBs of varying sizes may also be quite different. But this may be an acceptable and simple rule-of-thumb for choosing one technique over the other. Although $\tau_F$ is easier to obtain by monitoring the nominal simulation speed, estimating $\tau_C$ may not be easy without first simulating the CCBs. One approach could be to launch the simulations by using Technique 2 on the smallest concurrent groups (say, where G=1 or G=2) at first which would provide an estimation of $\tau_C$, and using this estimate to make further decisions. There could be other approaches or heuristics for estimating $\tau_C$.

Such an adaptive algorithm may cause the decision making to vary based on the number of machines and other factors, which in turn can make the sensitization results have some variation from run to run. But such variations in results may not be significant.

Figure 2:
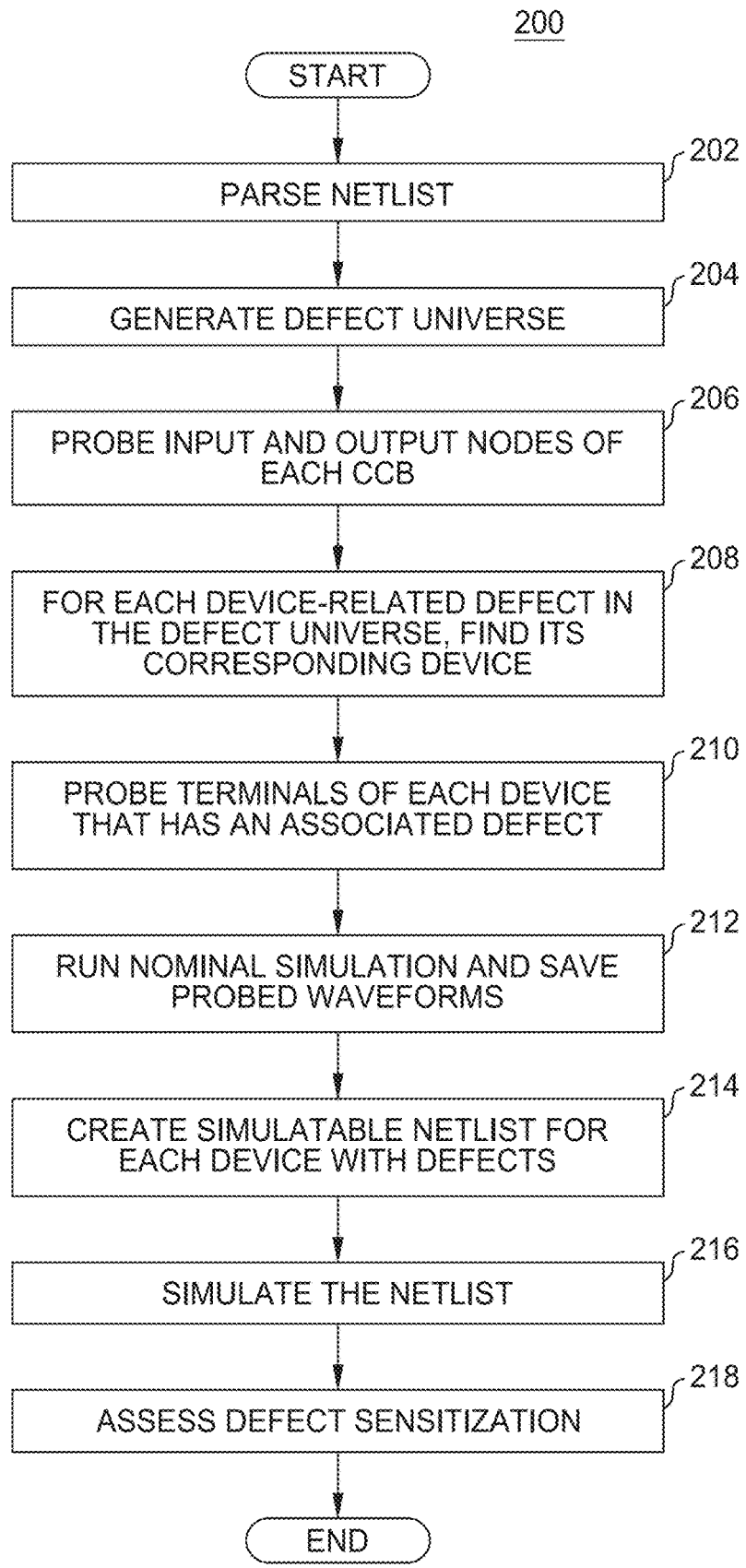
FIG. 2 is a flowchart of an example technique for determining defect sensitization.

Technique 3 may be faster but less accurate than Technique 1 and Technique 2. FIG. 2 is a flowchart of a method 200 performed during Technique 3. In particular embodiments, a computer system (e.g., the computer system 1400 shown in FIG. 14) performs the method 200. Generally, Technique 3 involves generating a simulatable netlist for each device with a defect in the defect universe. Each netlist may describe multiple circuits depending on the number of defects related to the device. For example, a netlist may describe a circuit for each defect related to a device. Simulating the netlist will simulate each defect in the device.

At 202, the computer system parses the netlist for the circuit design to identify the components and connections in the circuit design. The circuit netlist is read into a circuit database with device connectivity information. At 204, the computer system generates the defect universe, which indicates the locations in the circuit design where defects (e.g., short circuits, open circuits, etc.) may be injected.

At 206, the computer system associates each defect in the defect universe (e.g., a short defect between the source and drain terminals of a MOSFET whose full hierarchical name is X1.X2.M1) with a specific device in the circuit design. In this step, for each such defect, the related device is identified. At 208, the computer system adds a voltage probe to the terminals of each device identified at 206. For instance, if there is at least one defect associated with MOSFET XL.X2.M1, the computer system probes all the terminals (e.g., drain, gate, source, and bulk) of this device. At 210, the computer system simulates the full defect-free circuit and saves the waveforms probed at 208. This creates a set of baseline output waveforms.

At 212, for each of the devices which has at least one corresponding defect in the defect universe, the computer system creates a netlist that has the following:

(1) One circuit consisting of the defect-free device and PWL (piece-wise-linear) voltage sources at each of the terminals of the device corresponding to the baseline output waveforms saved at 210. For a MOSFET, there will be PWL voltages at each of the drain, gate, source, and bulk terminals based on their corresponding waveforms saved during defect-free simulation of the full circuit.

(2) If the device has N different defects in the defect universe, then N more circuits would be added to this netlist corresponding to each of the defect models. Each such circuit will have a device with an injected defect and PWL terminal voltage sources exactly as for the defect-free device in the netlist.

The namespaces of the devices and their terminals for the N+1 different circuits described above are distinct. There should be no name overlap (except ground/0 node) among these circuits such that the electrical behavior of the various defective versions of the device do not interfere with each other and with the defect-free version.

(3) Currents through all the PWL voltage sources in the netlist are probed.

At 214, the computer system runs the simulations for the netlists created at 212, one for each of the devices in the circuit that has at least one corresponding defect in the defect universe. If multiple computers are available, then such simulations can be run in parallel. Also, optionally, the multiple different netlist files generated at 212 may be combined into one file (ensuring that the namespaces are distinct) and then simulated. Based on available compute resources, a decision could be made to either run the netlists separately as created at 212 or combine them suitably. Running many individual small simulations versus running fewer, larger simulations is a tradeoff that can be worth considering.

At 218, the computer system assesses defect sensitization for the circuit design. A defect will be considered sensitized if, after simulation, the currents through the corresponding terminals of a device's defective version are found to be substantially different than those in the defect-free version simulated via the same netlist. For instance, in the case of a MOSFET with a short defect between source and drain, if the probed current through the PWL voltage source driving the drain of a defective version of the MOSFET is significantly different from the current through the PWL voltage source driving the drain of the defect-free version of the same MOSFET (e.g., as shown in the baseline output waveform), then this defect is considered sensitized. The significance of the difference between the two currents could be decided by comparing with a tolerance margin decided by the user of this technique.

Technique 3 provides certain technical advantages. For example, Technique 3 is less complicated than Technique 1 and Technique 2, because Technique 3 does not involve CCG (channel-connected graph) creation or analysis. Additionally, because one device at a time simulated and the various defective and defect-free versions of the devices in the same netlist are all independent, each simulation should be very fast.

Figure 5:
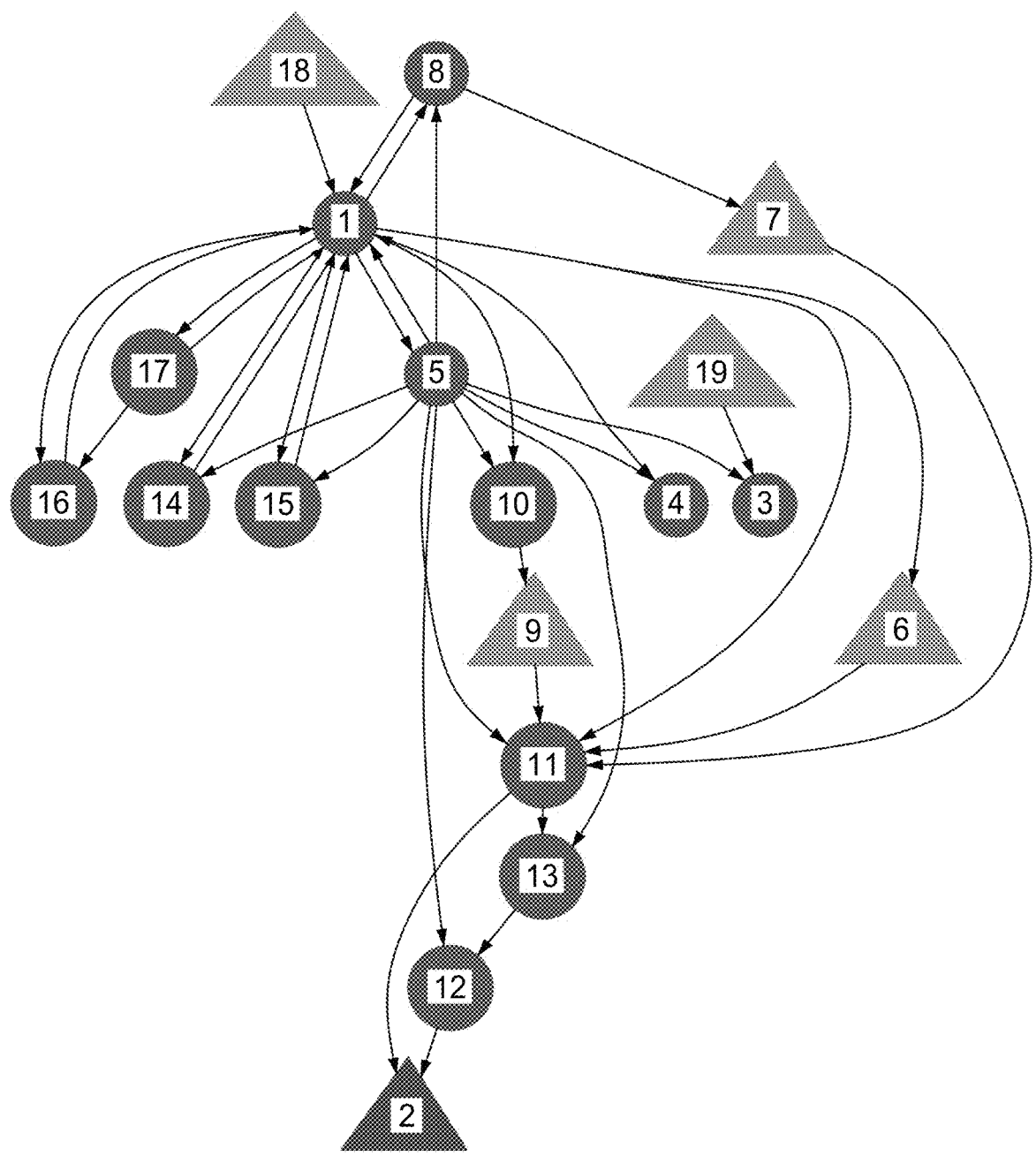
FIG. 5 illustrates an example graph used to determine defect sensitization.

Techniques 1 and 2 may be demonstrated using a bandgap circuit. This circuit has 132 MOSFETs. The defect universe includes 370 short and 260 open defects involving MOSFET terminals. FIG. 5 shows the CCG 500 of this circuit (e.g., generated at 106 shown in FIG. 1A). As seen in FIG. 5, the CCG 500 includes nodes representing the CCBs in the circuit. The nodes labeled 1, 3, 4, 5, 8, 10, 11, 12, 13, 14, 15, 16, and 17 are red circles representing analog blocks in the circuit. The node labeled 2 is a purple triangle representing a two-input NAND or NOR gate in the circuit. The nodes labeled 6, 7, 9, 18, and 19 are green triangles representing inverters in the circuit. The CCG 500 includes an edge between two nodes if there is a connection between the CCBs represented by those nodes. The edge includes an arrow representing the direction of signal propagation between the CCBs.

Figure 6:
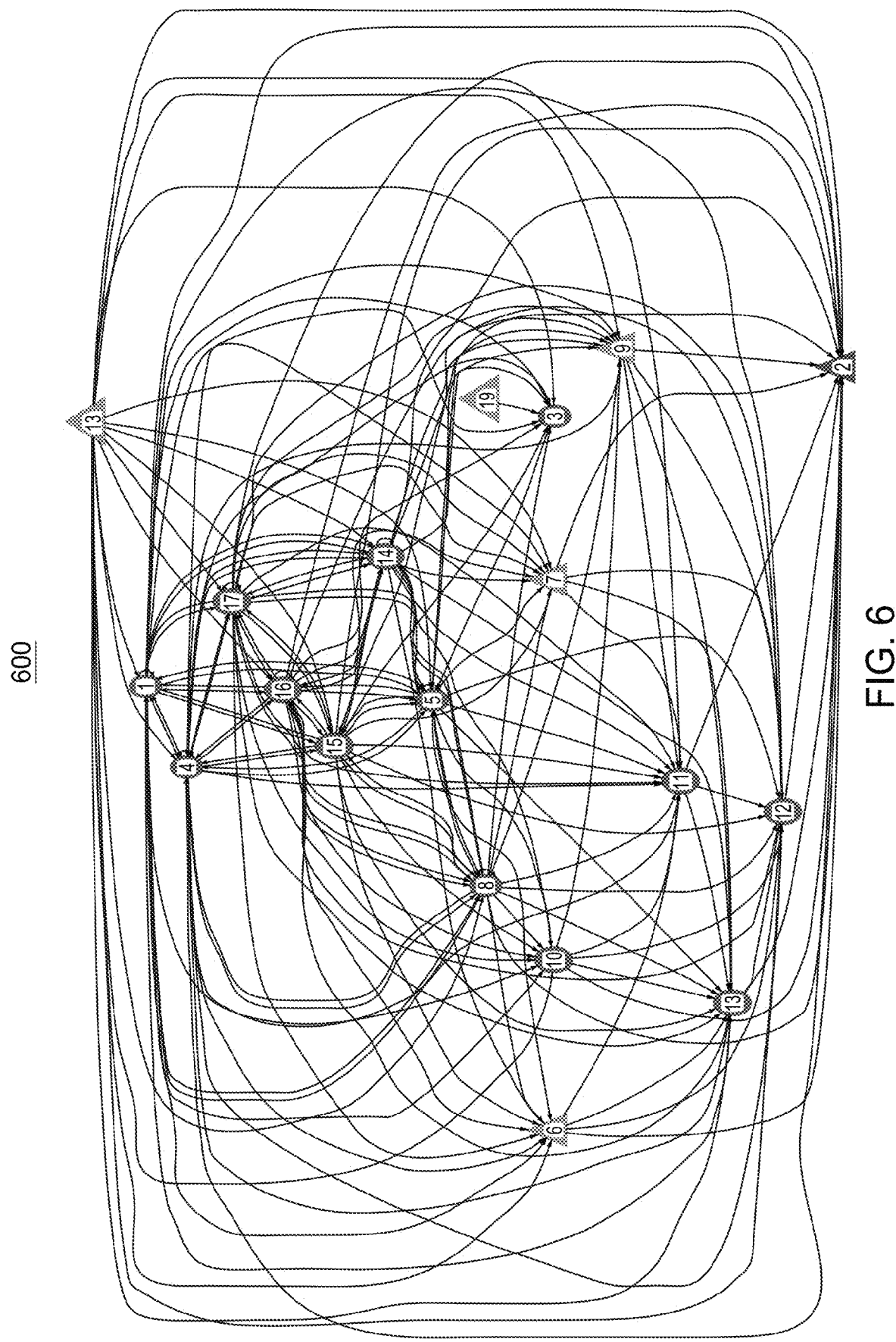
FIG. 6 illustrates an example transitive closure graph used to determine defect sensitization.

FIG. 6 shows a transitive closure 600 of the CCG 500 (e.g., generated at 122 shown in FIG. 1B). The transitive closure 600 indicates the nodes in the CCG 500 that are reachable from other nodes in the CCG 500. From the transitive closure, the following cliques (e.g., sets of nodes that are connected to each other or reachable from each other) are obtained (each clique is shown using bracket notation with nodes identified by their node numbers):

1. [19, 3]
2. [18, 5, 4, 8, 17, 14, 16, 1, 15, 11, 12, 13, 2, 6]
3. [18, 5, 4, 8, 17, 14, 16, 1, 15, 11, 12, 13, 2, 9, 10]
4. [18, 5, 4, 8, 17, 14, 16, 1, 15, 11, 12, 13, 2, 7]
5. [18, 5, 4, 8, 17, 14, 16, 1, 15, 3]

The sets of independent nodes (CCBs) where defects could be injected simultaneously were determined as:

1. 10, 3, 6, 7
2. 11, 3
3. 1, 19
4. 12, 19
5. 12, 3
6. 13, 19
7. 13, 3
8. 14, 19
9. 15, 19
10. 16, 19
11. 17, 19
12. 18, 19
13. 19, 4
14. 19, 5
15. 19, 6, 7, 9
16. 19, 8
17. 2, 3
18. 3, 6, 7, 9

Depending on the number of defects that are mapped to each CCB, not all of the possible independent set combinations may be utilized. For instance, the number of MOSFETs in CCB 19 may be only two. The total number of defects mapped to this CCB may be nine (four MOS open defects and five MOS short defects). However, CCB 19 appears in twelve different combinations above. The nine defects in CCB 19 may be insufficient to utilize all the possible independent CCB combinations.

Table 1 shows the groups of concurrently injectable defects discovered and their sizes. Technique 1 assigns the 630 defects into 576 different groups of concurrently simulatable defects. 542 of the defects may be simulated individually.

TABLE 1

| Number of concurrent defects | Frequency |
| --- | --- |
| 4 | 10 |
| 2 | 24 |
| 1 | 542 |

Table 2 shows the total number of defects injected into CCB combinations. The bottom fourteen rows of Table 2 (542 defects) correspond to scenarios where concurrency is not possible.

TABLE 2

| Number of defects | Independent CCBs |
| --- | --- |
| 9 | 19, 6, 7, 9 |
| 1 | 3, 6, 7, 9 |
| 24 | 10, 3 |
| 1 | 10 |
| 9 | 18 |
| 9 | 4 |
| 11 | 5 |
| 14 | 15 |
| 15 | 16 |
| 19 | 14 |
| 20 | 2 |
| 24 | 8 |
| 25 | 12 |
| 39 | 17 |
| 40 | 11 |
| 49 | 13 |
| 267 | 1 |

These 542 individual defects may be simulated using Technique 2 (via partitioned CCB). Whether the 24 2-defect groups (shown in row three of Table 2) or the 10 4-defect groups (shown in rows 1 and 2 of Table 2) are simulated by Technique 1 or 2 may be decided by a heuristic method described above.

FIG. 7 shows a graph 700 of the sorted sensitization results. Two possible "knee" point choices 702 and 704 are shown with circles in the graph 700. The knee point choices 702 and 704 correspond to sensitization values of 0.1 V and 0.2 V. These sensitization values may be selected as the sensitization thresholds used to determine whether a simulated defect is sensitized or not (e.g., at 132 shown in FIG. 1B and at 146 shown at FIG. 1C). Sensitization of a defect may be calculated by the difference between defective and defect-free simulation waveforms at designated observation points for each defect. Because a defect may have multiple such observation points, the maximum value of such differences is considered for each defect. The difference values are sorted and plotted.

Figure 10:
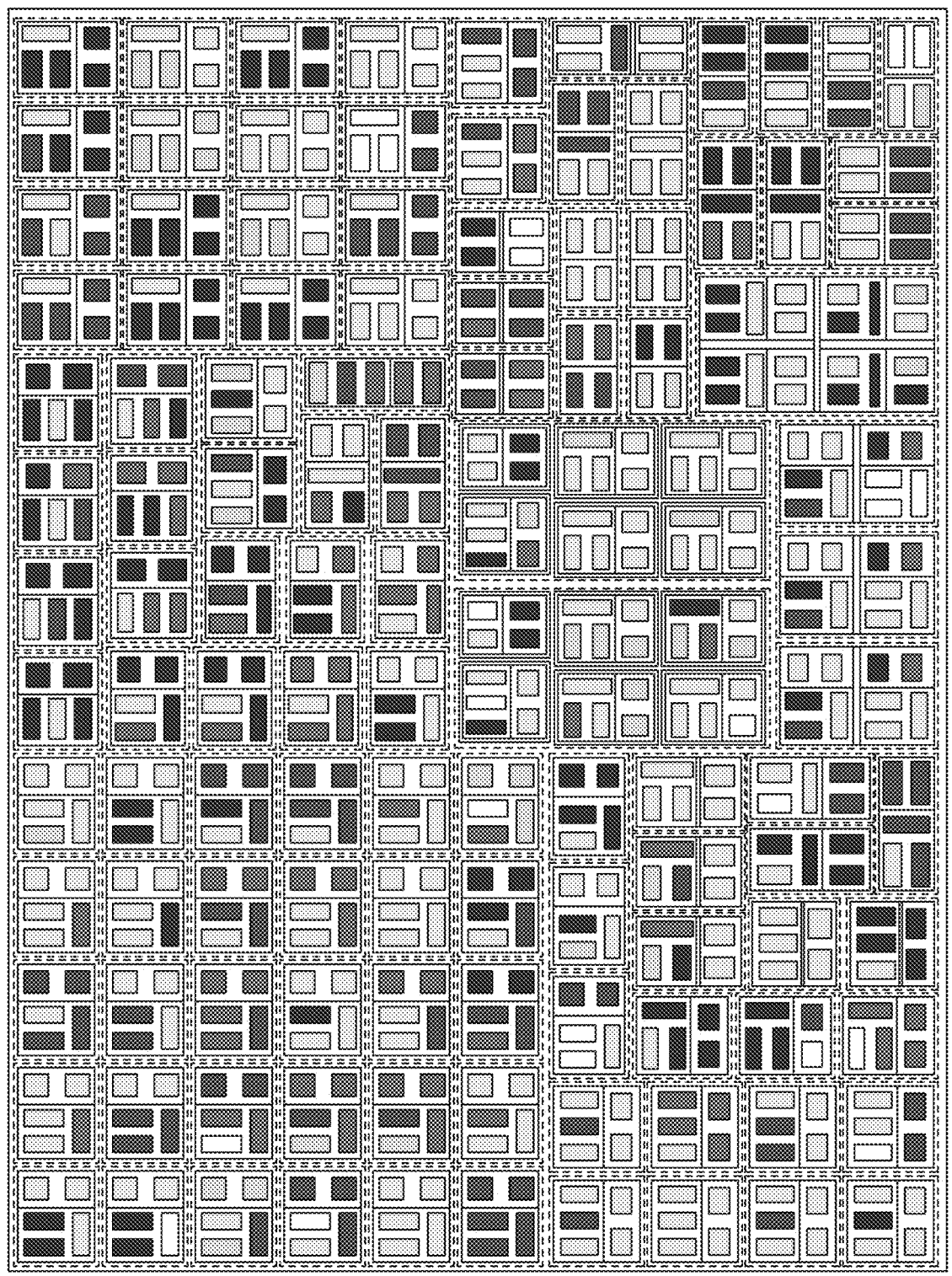
FIG. 10 illustrates an example sensitization heatmap.
Figure 11:
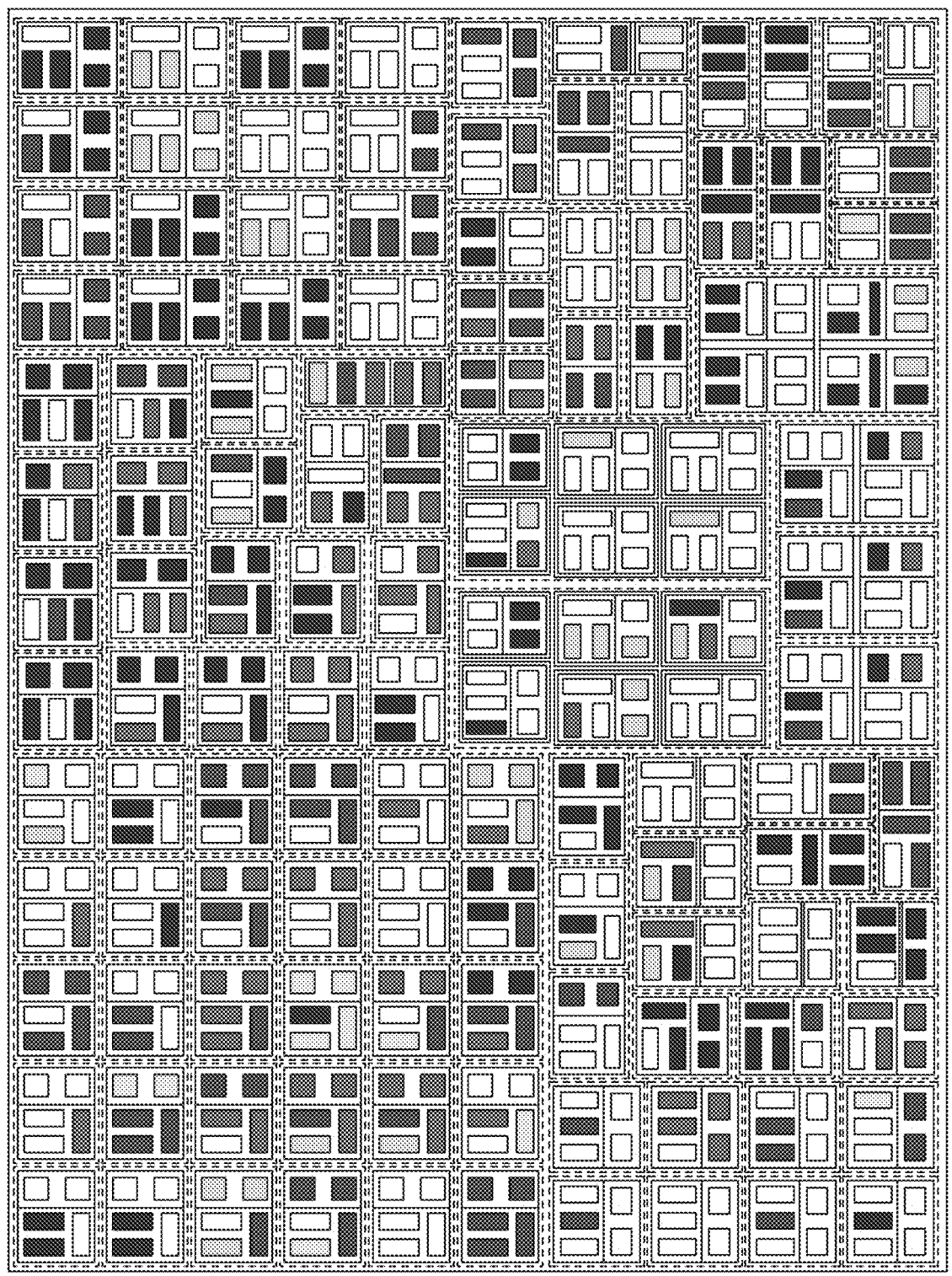
FIG. 11 illustrates an example sensitization heatmap.
Figure 12:
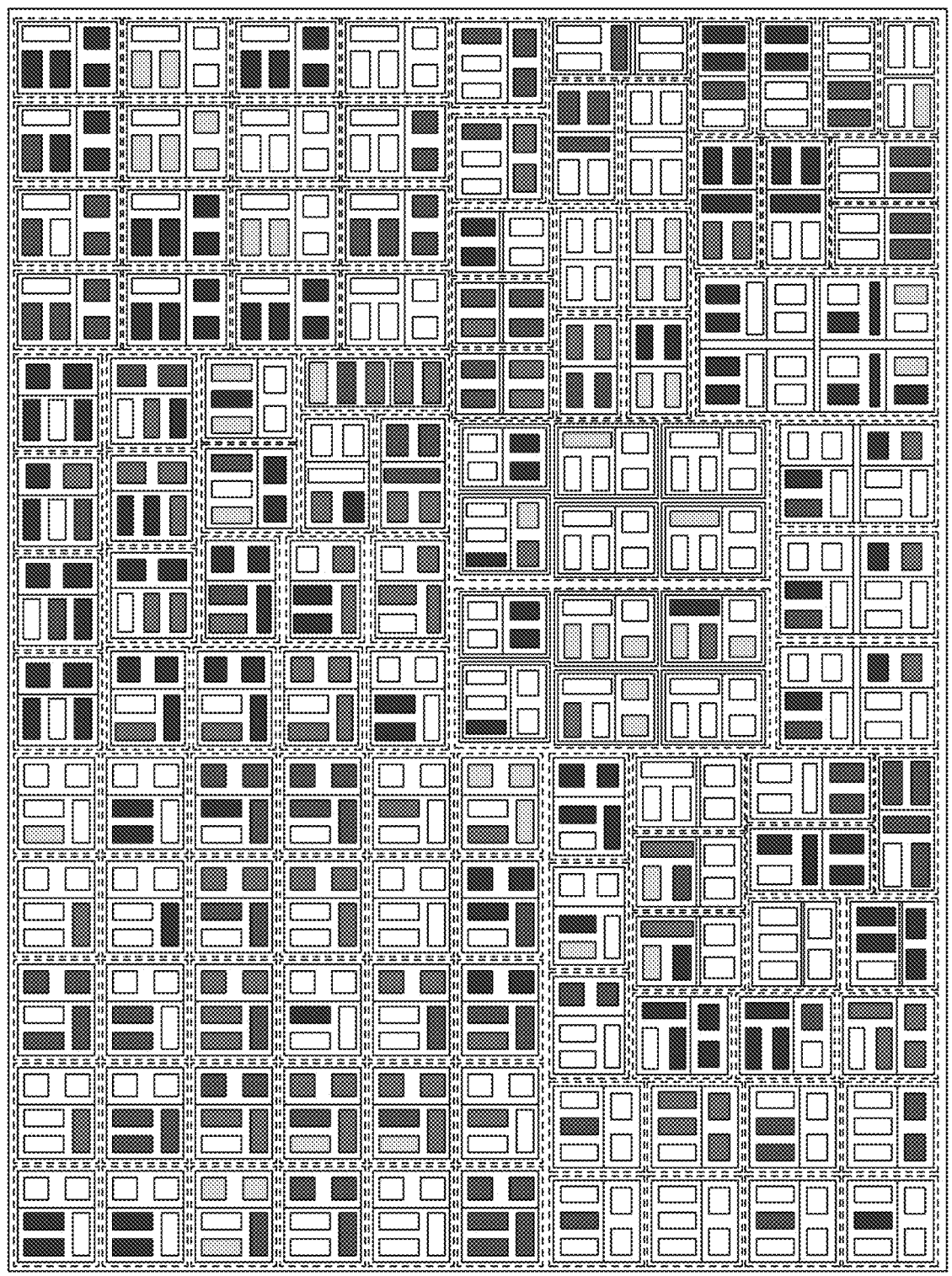
FIG. 12 illustrates an example sensitization heatmap.

The 630 defects along with their sensitization heatmaps with various threshold voltages are shown in FIGS. 10, 11, and 12. The heatmaps, based on treemap view of the circuit's device namespace, allow users to visualize which parts of the circuit are poorly sensitized and should be targeted with further test development.

FIG. 8 shows an example of a case where finding sensitization threshold could need logarithmic scale. Specifically, FIG. 8 shows a graph 802 and a graph 804. The graph 802 plots the sorted sensitization results for an example circuit on a linear scale. Two potential knee points 806 and 808 are identified using the graph 802. From the linear scale, it may not be clear which knee point 806 or 808 should be selected for the sensitization threshold. The graph 804 plots the sorted sensitization results for the circuit on a logarithmic scale. One potential knee point 810 is identified using the graph 804. The knee point 810 corresponds to the knee point 806 found in the graph 802. Based on these graphs 802 and 804, the knee point 806/810 may be selected for the sensitization threshold for the circuit.

Figure 9:
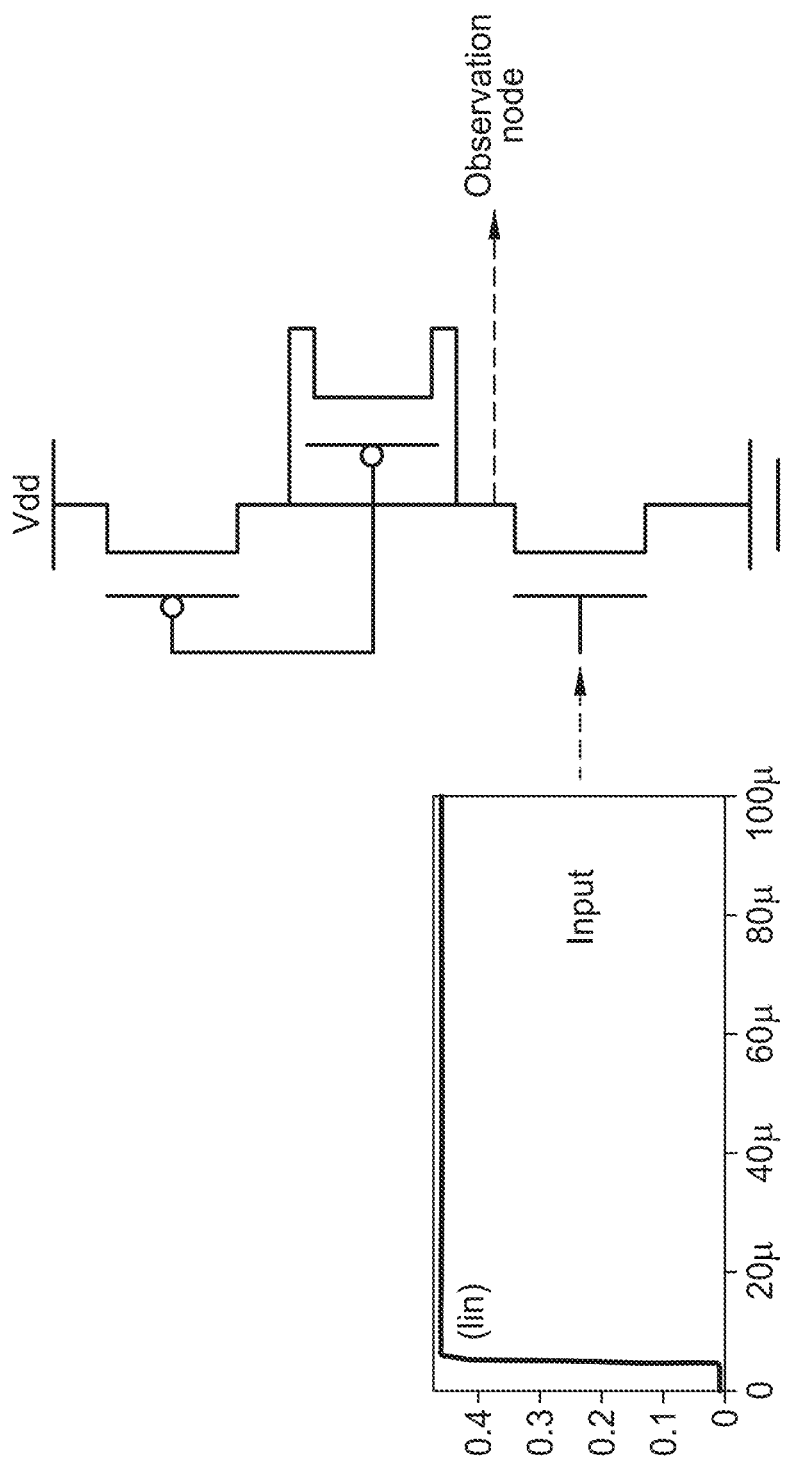
FIG. 9 illustrates an example circuit.

FIG. 9 shows an example of a CCB in the Bandgap example (e.g., the CCB represented by node number 5 shown in FIG. 5) set up for defect simulation using Technique 2. The input node signal is obtained via probing a nominal simulation of the full Bandgap circuit. The Vdd signal is also obtained similarly but not shown here because it has a constant value. A valid SPICE netlist for this CCB is automatically set up along with the input stimuli in PWL voltage source forms and simulated without any defect and with various defects mapped to this CCB, one at a time.

FIG. 10 shows raw sensitization maximum difference data for each defect presented as a heatmap 1000 in a treemap form. Each rectangle represents a particular defect. Darker rectangles indicate higher sensitization. FIG. 11 shows a heatmap 1100, which is the heatmap 1000 of FIG. 10 modified with a sensitization threshold of 0.1 Volts. Defects with less than 0.1 V of max difference value are considered not sensitized. FIG. 12 shows a heatmap 1200, which is the heatmap 1000 of FIG. 10 modified with a sensitization threshold of 0.2 Volts. Defects with less than 0.2 Volts of max difference value are considered not sensitized.

Analog defect simulation for calculating test coverage can be a very slow process as individual defects are simulated separately. The present disclosure addresses the case where the test engineer is willing to forgo the need to accurately calculate the coverage but needs to know which defects are not sensitized by existing tests in the fastest possible way. Three techniques for quickly assessing the sensitizations of defects in a circuit are described. Two of these techniques may be judiciously combined to achieve an improved outcome. Although the first of these techniques simulates the full circuit and speeds up the process by concurrently injecting multiple defects, the second technique simulates small partitions of the circuit to measure sensitization. A third technique, which is the fastest but least accurate, assesses sensitization by means of individual device simulations.

Figure 13:
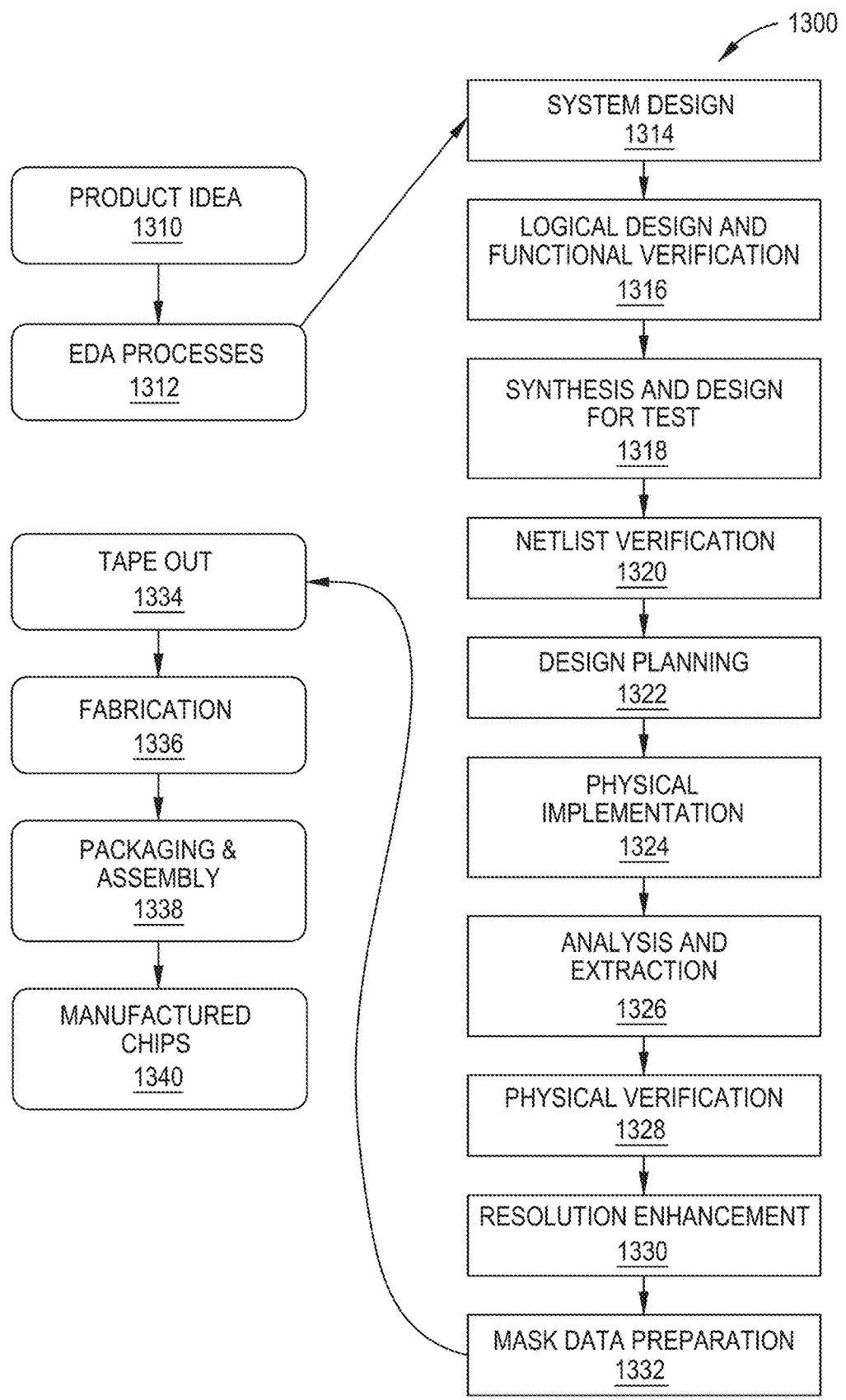
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 13. The processes described by be enabled by EDA products (or EDA systems).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 14:
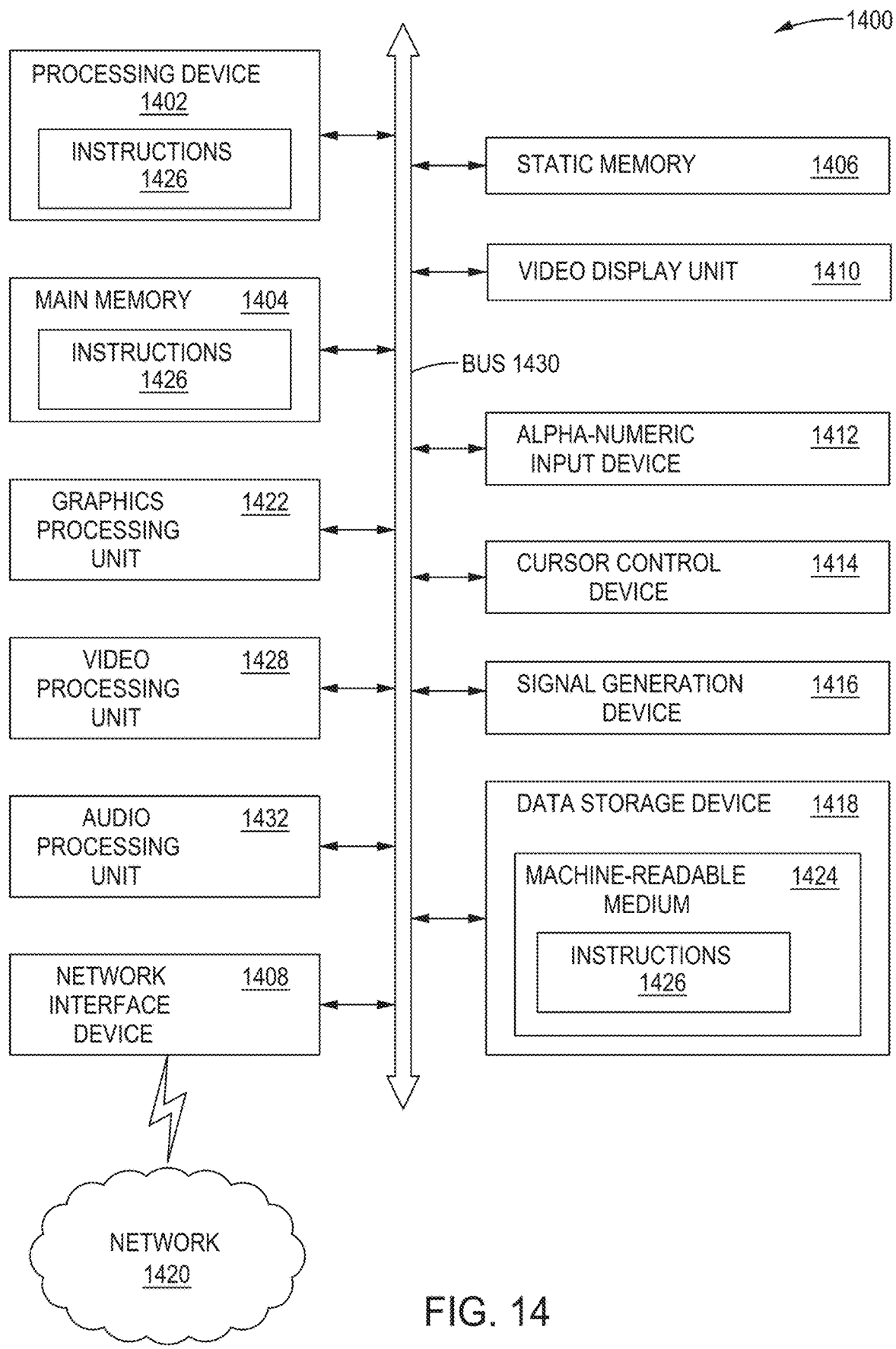
FIG. 14 depicts a diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of determining defect sensitization, the method comprising:
    parsing a netlist of a circuit design to determine a plurality of potential defects;
    partitioning the circuit design into a plurality of blocks;
    generating, based on the plurality of blocks, a graph representing the circuit design;
    determining a transitive closure of the graph indicating reachability relationships among the plurality of blocks;
    grouping the plurality of potential defects based on the reachability relationships among the plurality of blocks indicated by the transitive closure of the graph to produce a plurality of groups of potential defects;
    selecting a potential defect from each group of the plurality of groups to form a simulation group of potential defects;
    simulating the circuit design by injecting, into the circuit design, every potential defect of the simulation group to produce a set of outputs of the plurality of blocks; and
    determining a defect sensitization for the simulation group of potential defects based on the set of outputs of the plurality of blocks.

2. The method of claim 1, wherein partitioning the circuit design into a plurality of blocks comprises:
    identifying a plurality of power-nets in the circuit design; and
    disconnecting the circuit design at a portion of the plurality of power-nets to form the plurality of blocks.

3. The method of claim 1, wherein the graph is a directed graph, and wherein each node of the directed graph is a block of the plurality of blocks.

4. The method of claim 1, wherein an edge in the graph indicates a direction of signal propagation in the circuit design.

5. The method of claim 1, further comprising:
    probing an input port and output port of each node in the graph; and
    simulating the circuit design to produce a plurality of waveforms for the input port and the output port of each node in the graph.

6. The method of claim 5, wherein determining the defect sensitization comprises comparing the plurality of waveforms to the set of outputs of the plurality of blocks.

7. The method of claim 6, wherein comparing the plurality of waveforms to the set of outputs of the plurality of blocks comprises:
    calculating an absolute difference between the plurality of waveforms and the set of outputs of the plurality of blocks time-point by time-point;
    integrating the absolute difference to produce a value; and
    dividing the value by a total transient time.

8. The method of claim 1, wherein potential defects in a first group of the plurality of groups of potential defects have no effect on sensitization of potential defects in a second group of the plurality of groups of potential defects different from the first group.

* * * * *